US004001733B2

United States Statutory Invention Registration [19]

[11] Reg. Number: H1733

[45] Published: Jun. 2, 1998

Nara et al.

[54] EXPOSURE METHOD

[75] Inventors: Kei Nara, Yokohama; Masaichi Murakami, Setagaya-ku; Nobutaka Fujimori, Fujisawa, all of Japan

[73] Assignee: Nikon Corporation, Japan

[21] Appl. No.: 539,986

[22] Filed: Oct. 6, 1995

[30] Foreign Application Priority Data

Oct. 7, 1994 [JP] Japan ..... 6-270379

[51] Int. Cl.[6] ..... G03F 9/00

[52] U.S. Cl. ..... 430/22

[58] Field of Search ..... 430/5, 22, 30; 356/399–401

[56] References Cited

U.S. PATENT DOCUMENTS

| | | | |
|---|---|---|---|
| 4,371,264 | 2/1983 | Lacombat et al. | 356/401 |
| 4,815,854 | 3/1989 | Tanaka et al. | 356/401 |
| 4,853,745 | 8/1989 | Kamiya et al. | 356/401 |
| 4,880,310 | 11/1989 | Nishi | 356/401 |
| 4,984,890 | 1/1991 | Tojo et al. | 356/401 |
| 5,155,557 | 10/1992 | Iwazawa et al. | 356/401 |
| 5,189,494 | 2/1993 | Muraki | 356/401 |
| 5,214,493 | 5/1993 | Sugiyama et al. | 356/401 |
| 5,231,467 | 7/1993 | Takeuchi et al. | 356/401 |

*Primary Examiner*—Charles T. Jordan
*Assistant Examiner*—Meena Chelliah
*Attorney, Agent, or Firm*—Pennie & Edmonds LLP

[57] ABSTRACT

An exposure method for transferring a pattern on a mask onto a photosensitive substrate. The exposure method has steps of (1) preparing the mask with a first alignment mark and the substrate with a second alignment mark, a length of the first alignment mark in a scan direction being shorter than a length of the second alignment mark in the same direction; (2) scanning the first and second alignment marks; (3) detecting an intensity of the light which has been emitted from the light source optical system and irradiated the mask and the substrate; (4) calculating an amount of dislocation between the first and second alignment marks in the scan direction; (5) correcting the dislocation between the mask and the substrate; (6) effecting an exposure to transfer the pattern on the mask onto the substrate.

14 Claims, 9 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

EXPOSURE METHOD

BACKGROUND OF THE INVENTION

1. Field of the Invention

The present invention relates to an exposure method, in particular, which is preferably adopted as such an apparatus having a positioning mechanism for a mask and a photosensitive substrate.

2. Related Background Art

Conventionally, in the exposure apparatus using the exposure method of this type, a positioning mechanism having a structure such as that shown in FIG. 1 has been used in general. The basic action of this exposure apparatus 1 comprises the steps of irradiating an alignment mark 3A of a mask 3 and an alignment mark 4A of a photosensitive substrate 4, which are disposed so as to sandwich a projection optical system 2 therebetween, with alignment light; detecting the resulting diffracted light components to determine the positional relationship between the mask 3 and the photosensitive substrate 4; and then, on the basis of the result of detection, adjusting the positional relationship between the mask 3 and the photosensitive substrate 4.

The alignment light, which has been shaped into a predetermined form at the time when emitted from a light source optical system 5, is projected on the mask 3 by way of a movable mirror 6, an alignment optical system 35, and a fixed mirror 7. The alignment light passing through the mask 3 is projected on the photosensitive substrate 4 by way of the projection optical system 2.

The movable mirror 6 herein is positioned such that it can be moved in a direction of arrow A by a mirror-driving portion 6A. Along the movement of the movable mirror 6, the mask 3 and the photosensitive substrate 4 are scanned with the alignment light thereon. The position of the movable mirror 6, meanwhile, is monitored by a mirror-position detector (interferometer, encoder, or the like) 8.

When the alignment light overlaps with each mark at the time of scanning, the alignment light is scattered by the mark. In the exposure apparatus 1, the scattered light component (i.e. diffracted light component) is taken out by way of a half mirror 9 and a spatial filter 10 and then converted to an electric signal by a photodetector 11. Thereafter, on the basis of the positional information obtained by the mirror-position detector 8 and the light intensity signal obtained by the photodetector 11, the relative positions of the mask 3 and the photosensitive substrate 4 with respect to each other are calculated and determined by a mark-position calculating means 12.

FIG. 2 shows how the position of the alignment mark 4A formed on the photosensitive substrate 4 is detected. As shown in this drawing, the scattered light component from the alignment mark 4A passes through the mask 3 again and then is taken out by the half mirror 9 so as to be transmitted to the spatial filter 10. The spatial filter 10, meanwhile, has such a structure that the zero-order light component is cut off so as to transmit only the scattered light component to the photodetector 11.

Similarly, FIG. 3 shows how the position of the alignment mark 3A formed on the mask 3 is detected. As shown in this drawing, the scattered light component generated by the alignment mark 3A is taken out by the half mirror 9 so as to be transmitted to the spatial filter 10 and the photodetector 11. At this moment, the detection signal which is input into the mark-position calculating means 12 from the photodetector 11 has a wave form in which, as shown in FIG. 4, the position of its peaks correspond to the positions of the marks to be detected.

These two peaks are formed because, as the scattered light component from the alignment mark 4A is detected after passing through the mask 3, the alignment mark 4A and the alignment mark 3A have been positioned with a distance x therebetween so as not to overlap with each other. However, as the detected signal includes an amount of dislocation, a difference of $x+\Delta x$ (wherein $\Delta x$ is the amount of dislocation of the marks) is detected between the signal corresponding to the alignment mark 4A on the photosensitive substrate side and that corresponding to the alignment mark 3A on the mask side. The amount of dislocation $\Delta x$ can easily be calculated from the result of measurement since x is known.

SUMMARY OF THE INVENTION

In the exposure method in accordance with the present invention, while a first alignment mark disposed on a mask and a second alignment mark disposed on a photosensitive substrate are irradiated with a luminous flux, the first and second alignment marks are relatively scanned with the luminous flux and the positional relationship between the first and second alignment marks is detected by a position detector on the basis of optical information obtained from the first and second alignment marks. The second alignment mark is disposed on the photosensitive substrate at a position which is substantially conjugate with the first alignment mark and has a length in the scan direction longer than that of the first alignment mark. The first and second alignment marks are scanned with the luminous flux substantially simultaneously and thereby the position detector detects the positional relationship between the first and second alignment marks.

Preferably, there is further provided a driving mechanism for driving at least one of the mask and the photosensitive substrate so as to correct the relative relationship between the mask and the photosensitive substrate.

Preferably, the first alignment mark is a light-shielding mark.

In accordance with one aspect of the present invention, the exposure apparatus is provided with an illumination optical system for irradiating the photosensitive substrate with the luminous flux by way of the mask, while the position detector has a light-receiving portion for detecting, in the reflected light from the second alignment mark, the luminous flux passing through a periphery of the first alignment mark as the optical information.

In accordance with another aspect of the present invention, the exposure apparatus is provided with an illumination optical system for irradiating the photosensitive substrate with the luminous flux not by way of the mask, while the position detector has a light-receiving portion for detecting, in the reflected light from the second alignment mark, the luminous flux passing through a periphery of the first alignment mark as the optical information.

In the present invention, since the first alignment mark and the second alignment mark are disposed near positions which are substantially conjugate with and correspond to each other, the positional signals of the first and second alignment marks can be detected simultaneously and independently when scanned once with the luminous flux.

As the positional signals respectively corresponding to two marks can be obtained at the same time in this manner, errors caused by distortion of the alignment optical system can be eliminated. Also, as the positional signals of the first and second alignment marks can independently be detected, the processing for adjusting the gains of the positional signals obtained by two separate scans with the luminous flux can be eliminated. As a result, it is possible to obtain an exposure method which can further improve the positioning accuracy while improving the throughput.

Further, since the length of the second alignment mark in the scan direction is made longer than that of the first alignment mark in the scan direction, these marks can be disposed at positions which are conjugate with and correspond to each other.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

In the above-mentioned conventional technique, errors may occur in the result of detection due to distortion of the alignment optical system 35, since the alignment mark 3A and the alignment mark 4A have been disposed so as to keep away from each other. This is because the luminous flux from the alignment mark 3A and that from the alignment mark 4A respectively pass through different parts within the alignment optical system 35.

Also, while chromium (Cr) is generally used for the alignment mark 3A on the mask, various materials from a low-reflectance film of ITO or the like to a high-reflectance film of aluminum (Al) or the like are used for the alignment mark 4A on the photosensitive substrate. Accordingly, the scattered light intensity on the mask and that on the photosensitive substrate often differ greatly from each other. Thus, it is necessary for the marks to be separately subjected to automatic gain control processing in order to attain substantially the same level of light intensity. As a result, it is necessary for the taken-out signals to be divided into separate scans, thereby inevitably lowering the throughput and deteriorating the accuracy in measurement.

Figure 1:
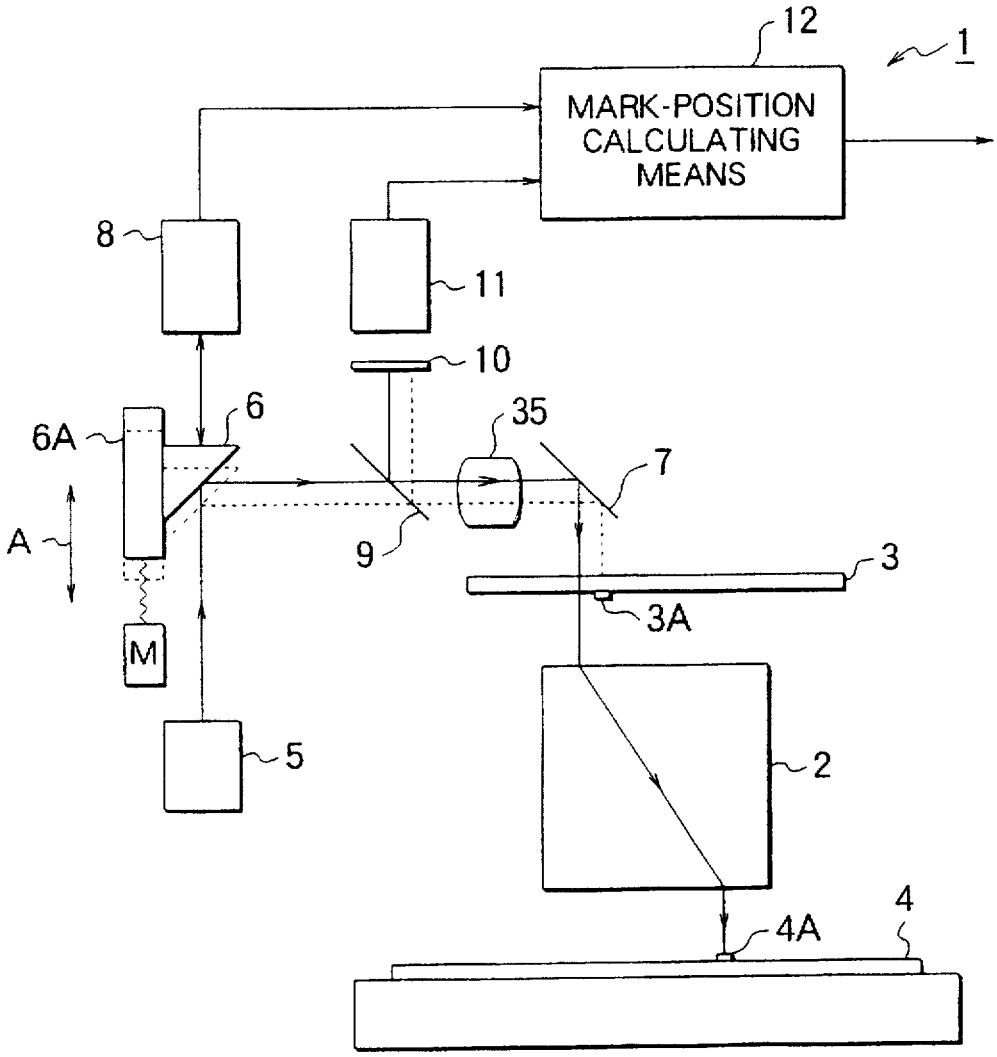
FIG. 1 is a schematic diagrammatic side view showing a conventional exposure apparatus.
Figure 2:
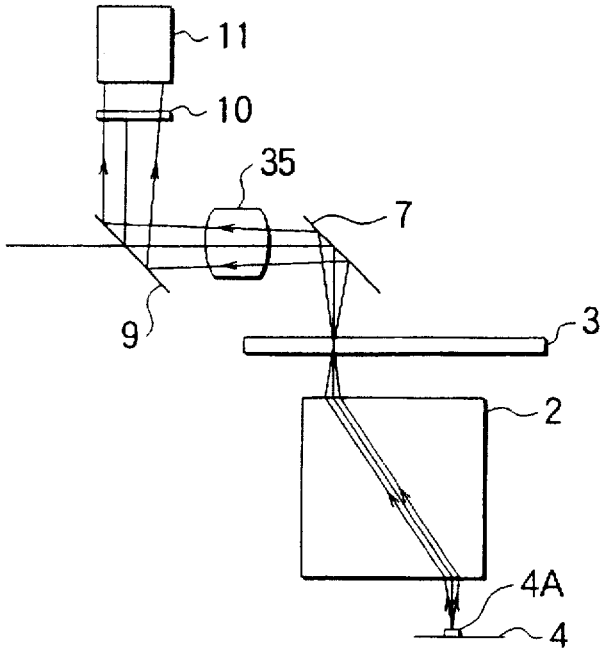
FIGS. 2–4 are schematic diagrammatic views showing the conventional exposure apparatus and a signal intensity distribution detected thereby.
Figure 3:
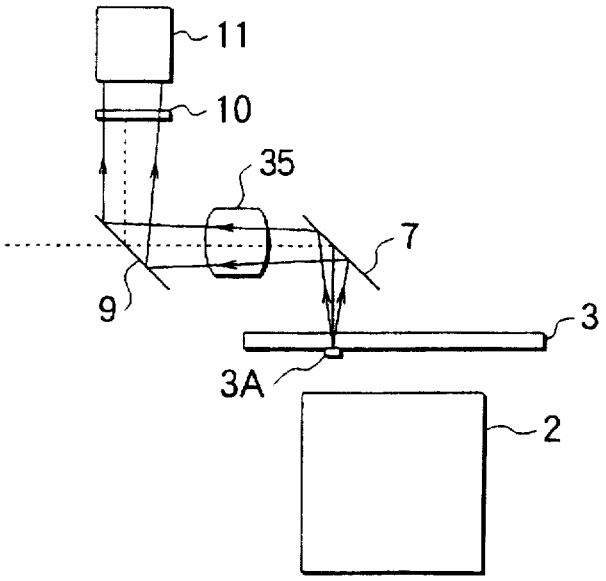
Figure 4:
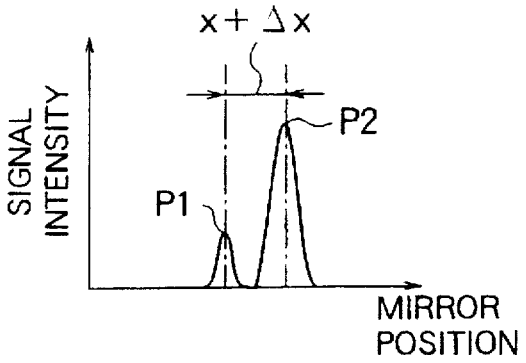
Figure 5:
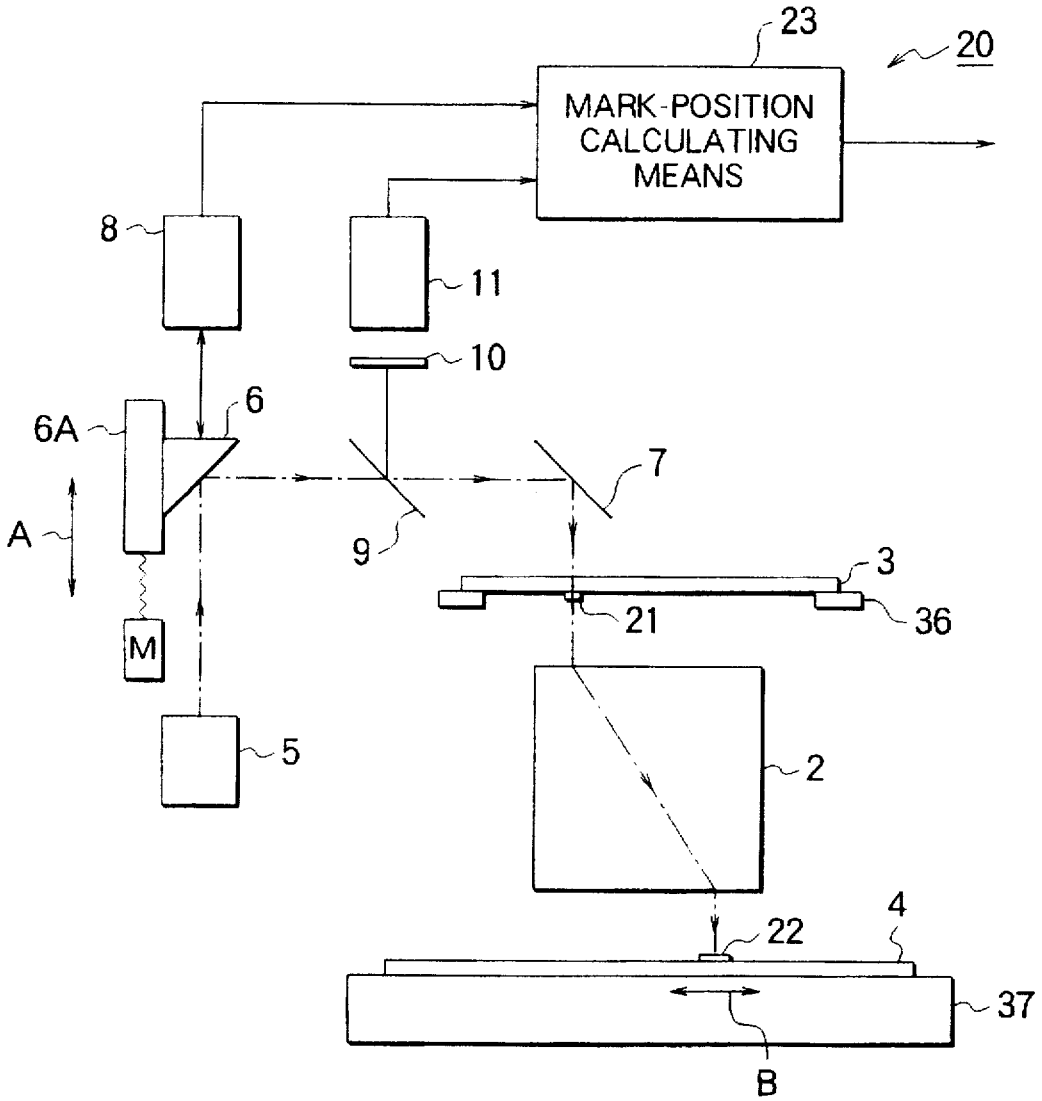
FIG. 5 is a schematic diagrammatic side view showing an exposure apparatus in accordance with an embodiment of the present invention.

FIG. 5 is a side view showing an embodiment of the present invention. In FIG. 5, the parts corresponding to those depicted in FIG. 1 are referred to by the same reference numerals. In FIG. 5, reference numeral 20 indicates an exposure apparatus as a whole. In this apparatus 20, alignment marks 21 and 22 are disposed at positions which are conjugate with and correspond to each other with respect to the projection optical system 2. Namely, the alignment mark 22 is disposed near a position on the photosensitive substrate 4 which is equivalent to the position of the alignment mark 21 on the mask 3. Accordingly, when (relatively) scanned once with alignment light, the relative positional relationship between the mask 3 and the photosensitive substrate 4 can be detected. The light source optical system 5 for the alignment light emits laser.

The alignment mark 22 formed on the photosensitive substrate 4 has a size with respect to the scan direction of alignment light (i.e., direction of arrow B in FIG. 5) longer than that of the alignment mark 21 formed on the mask 3 with respect to the same direction. The shapes and the like of the alignment marks 21 and 22 are as explained in the following. Namely, on a transparent portion such as glass, the alignment mark 21 on the mask is formed as a light-shielding portion (i.e., chromium pattern) which is the same as or slightly larger than the cross section of the alignment light such that, the alignment mark 22 is irradiated with the alignment light passing through the transparent portion outside of the alignment mark 21. On the other hand, the alignment mark 22 on the photosensitive substrate comprises a grating-like mark formed by an etched metal film or semiconductor film such that scattering (diffraction) is likely to occur at the mark.

Thus, the alignment mark 21 on the mask merely partially blocks the incident alignment light. In this embodiment, only the scattered light component generated at the alignment mark 22 formed on the photosensitive substrate is detected to determine the positions of the alignment marks 21 and 22. Accordingly, unlike the conventional technique, it is not necessary to divide the alignment light scan and adjust the difference in light intensity depending on whether the alignment mark is on the mask or on the photosensitive substrate.

Figure 6:
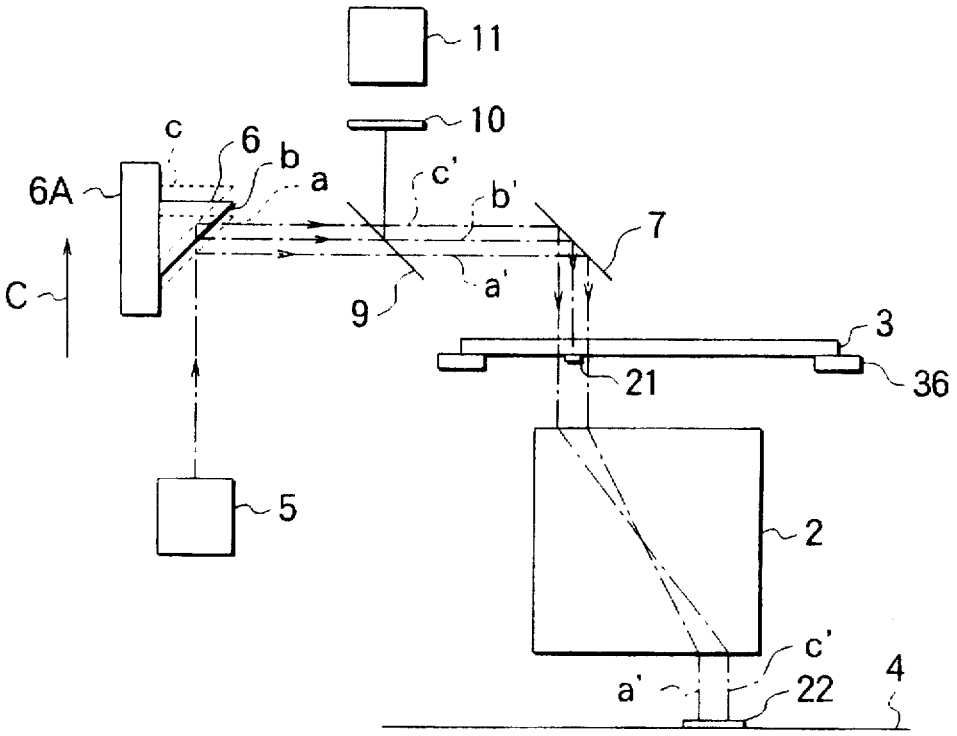
FIG. 6 is a schematic diagrammatic side view explaining the scanning of alignment marks with alignment light.
Figure 7:
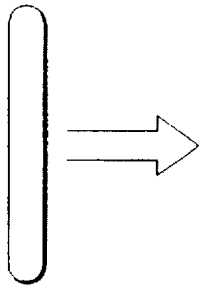
FIGS. 7–9 are schematic diagrammatic views showing a light intensity distribution corresponding to a relationship between an alignment mark on a mask and that on a photosensitive substrate.

In the structure explained above, the exposure method will be explained with reference to FIGS. 5–10 and 12. First, as shown in FIG. 5, the mask 3 on which the alignment mark 21 has been formed is mounted on a mask stage 36, whereas the photosensitive substrate 4 is mounted on a substrate stage 37 (step S1 in FIG. 12). The alignment mark 22 has been formed on the photosensitive substrate 4 in the preceding steps. Then, as shown in FIG. 6, the movable mirror 6 is moved in the direction of the arrow C (a→b→c) so that the alignment marks 21 and 22 are relatively scanned with the alignment light (step S2 in FIG. 12). At this moment, the optical axis of the alignment light moves in the direction of a'→b'→c' along the movement of the movable mirror 6. Accordingly, a change in light intensity such as that shown in FIG. 9 is detected at the photodetector 11 (step S3 in FIG. 12).

This change in light intensity is obtained as explained in the following. Namely, for some time after the start of scan, the alignment light impinges on a periphery area (i.e., transparent portion), on which the alignment mark 21 has not been formed, and passes through the mask 3 to irradiate the photosensitive substrate 4 while moving thereon. Then, the alignment light passing through the mask 3 moves onto the alignment mark 22 formed on the photosensitive substrate 4 (i.e., position where the optical axis is at a'), whereby the scattered light component scattered (diffracted) on the mark is detected by the photodetector 11.

When the scan with the alignment light is further continued, the alignment light comes to irradiate the alignment mark 21 formed on the mask 3 (i.e., position where the optical axis is at b'), while the alignment light passing through the mask 3 to reach the photosensitive substrate 4 is gradually shielded by the alignment mark 21. Accordingly, the light intensity of the scattered light component from the alignment mark 22 gradually decreases so as to yield a trough in the detection output of the photodetector 11.

This condition continues until the alignment light moves to an edge portion of the alignment mark 21. Then, when the position of incidence of the alignment light moves again to the periphery area (i.e., transparent portion) where the alignment mark 21 has not been formed (i.e., position where the optical axis is at c'), the scattered light component from the alignment mark 22 is detected by the photodetector 11 again, thereby increasing the light intensity again. When the alignment light further moves to the portion where the alignment mark 22 has not been formed, the light intensity decreases again to zero.

In this manner, the light intensity distribution corresponding to the positional relationship between the alignment mark 21 on the mask and the alignment mark 22 in the photosensitive substrate, i.e., including the positional information on the alignment mark 21 and the positional information on the alignment mark 22, is detected by a mark-position calculating means 23. The mark-position calculating means 23 detects, on the basis of the first-order differential wave form of the signal corresponding to the light intensity distribution, an amount of dislocation $\Delta W$ generated in the alignment marks 21 and 22.

Figure 8:
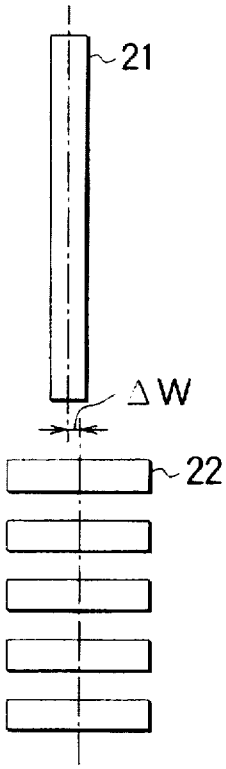
Figure 9:
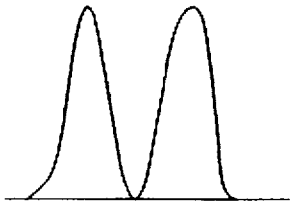
Figure 10:
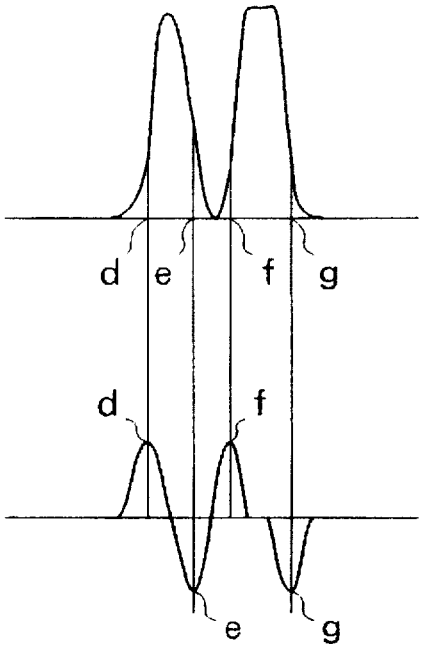
FIG. 10 is schematic diagrammatic view explaining a step for detecting an amount of dislocation.

For example, when the alignment mark 21 on the mask is dislocated toward the upstream of the alignment light scan direction with respect to the alignment mark 22 on the photosensitive substrate as shown in FIG. 8, the earlier peak in the two peak wave forms becomes thinner while the later peak becomes thicker as shown in the graph of FIG. 9 or 10. The axis of abscissa of FIG. 9 corresponds to the position of scan with the alignment light shown in FIG. 7. In this case, since the peak points of the first-order differential wave form shown in the lower graph of FIG. 10 correspond to the edge portions of the alignment marks 21 and 22, the mark-position calculating means 23 determines, on the basis of the positional information obtained from the mirror-position detector 8, positions d, e, f, and g which provide the peak points of the first differential wave form and then calculates the amount of dislocation $\Delta W$ according to the following equation (step S4 in FIG. 12):

$$\Delta W = \frac{(g-f)-(e-d)}{2}$$

Figure 12:
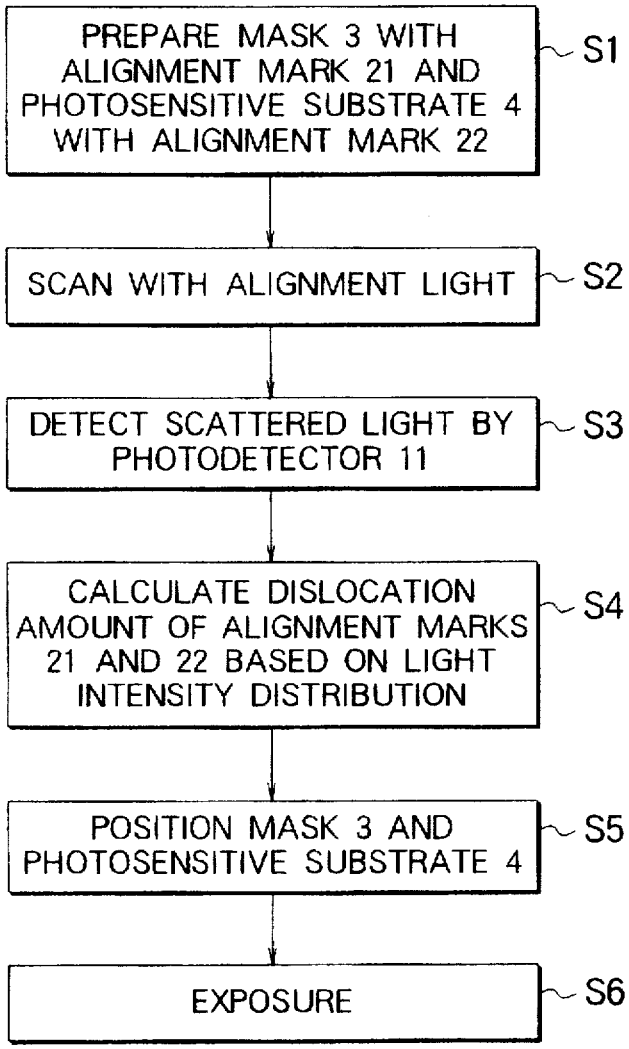
FIG. 12 is a flowchart showing an exposure method of the present invention.

After the amount of dislocation is calculated in this manner, this amount of dislocation $\Delta W$ is used to relatively move the mask 3 or the photosensitive substrate 4 to correct the positional dislocation (step S5 in FIG. 12), thereby effecting the exposure under a condition where there is no dislocation of the pattern so as to transfer the pattern of the mask 3 to the photosensitive substrate 4 (step S6 in FIG. 12).

In the structure explained above, since the amount of dislocation $\Delta W$ between the alignment marks 21 and 22 can be calculated by only one scan with the alignment light, an exposure apparatus yielding a throughput which is much higher than that conventionally obtained can be realized.

Also, since the alignment mark 21 on the mask and the alignment mark 22 on the photosensitive substrate can be disposed in a conjugate relationship with each other with respect to the projection optical system 2, the positional errors resulting from distortion of the projection optical system and the like can be eliminated as much as possible, thereby attaining an accuracy in detection much higher than that conventionally obtained.

Though the foregoing embodiment explains a case where the alignment light emitted from the light source optical system 5 impinges on the upper surface of the mask 3 and the alignment light passing through the projection optical system 2 impinges on the photosensitive substrate 4, the present invention is not restricted thereto but also applicable to a case where the alignment light is introduced between the projection optical system 2 and the photosensitive substrate 4 to directly impinge on the photosensitive substrate 4. An example of the latter case is shown in FIG. 11 with the same reference numerals being applied to the parts corresponding to those of FIG. 5.

In this exposure apparatus 30, the alignment light is guided onto the alignment mark 22 on the photosensitive substrate 4 by the half mirror 9 and the scattered light thereon is detected by way of the projection optical system 2 and the mask 3. In this case, however, the alignment mark 21 on the mask does not prevent the alignment light from reaching the photosensitive substrate 4 but prevents the scattered light from reaching the photodetector 11.

When input in this manner, the alignment light passes through the projection optical system 2 only once. Accordingly, its loss in quantity of light is smaller than that in the above-mentioned embodiment.

Figure 11:
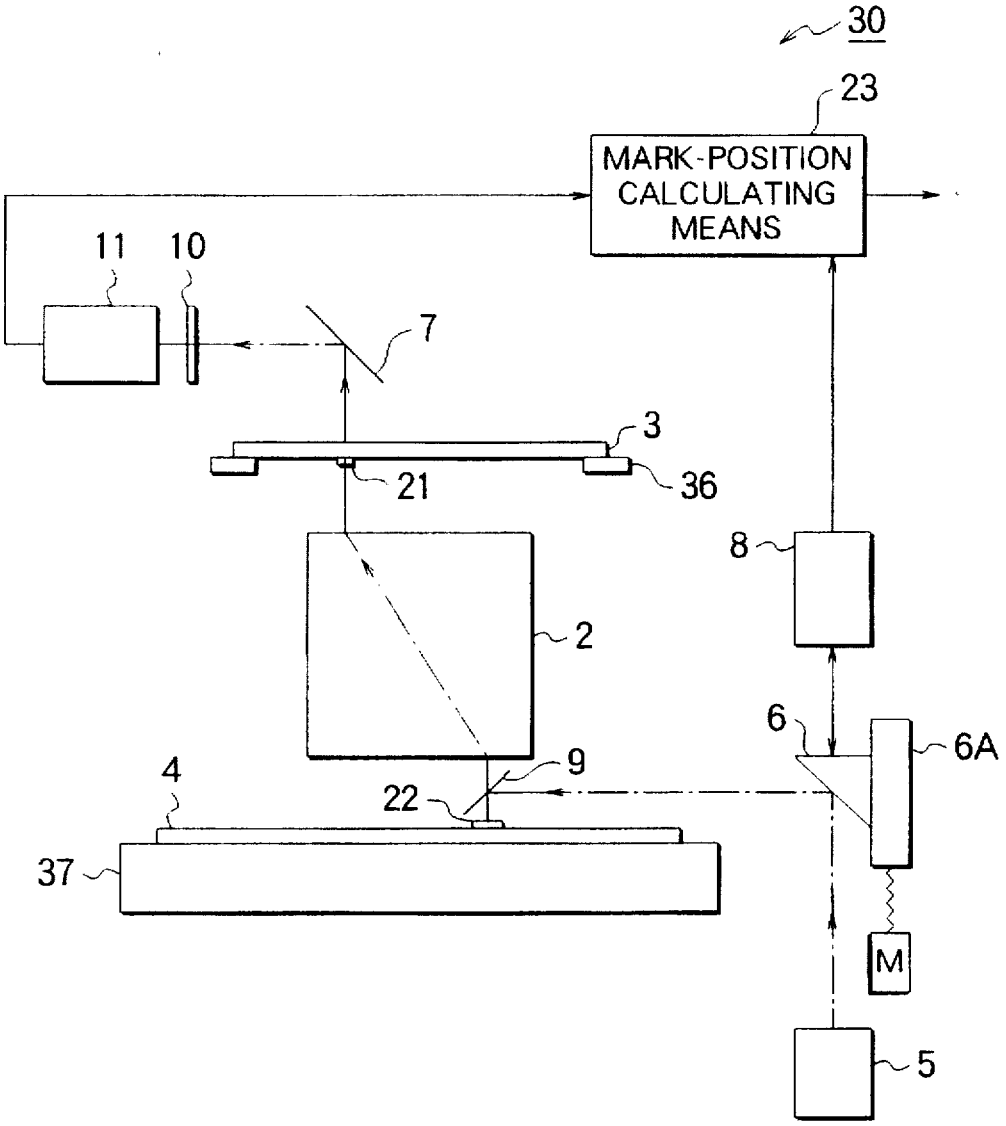
FIG. 11 is a schematic diagrammatic side view showing an exposure apparatus in accordance with another embodiment of the present invention.

Further, though the embodiments of FIGS. 5 and 11 explain cases where the alignment mark 21 on the mask and the alignment mark 22 on the substrate are formed as shown in FIG. 8, they may be formed in other manners as long as the length of the alignment mark on the photosensitive substrate in the alignment light scan direction is made longer than that of the alignment mark on the mask in the same direction.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 270379/1994 (6270379) filed on Oct. 7, 1994 is hereby incorporated by reference.

What is claimed is:

1. An exposure apparatus for transferring a pattern on a photosensitive substrate, comprising:

a mask stage which holds a mask on which said pattern and a first alignment mark are formed, said first alignment mark being a light shielding type mark;

a substrate stage which holds said photosensitive substrate having a second alignment mark longer in a predetermined direction that said first alignment mark so that said second alignment mark is corresponding to said first alignment mark;

a scanning mechanism which scans a light beam along said predetermined direction so as to traverse at least said first alignment mark, said second alignment mark being illuminated with said light beam which passes near said first alignment mark in a scanning of said scanning mechanism;

a first detector which detects said light beam reflected on said second alignment mark; and an operating unit which calculates an amount of dislocation between said make and said photosensitive substrate.

2. An exposure apparatus according to claim 1, further comprising: a driving unit for driving at least one of said mask stage and said substrate stage on the basis of a calculated result of said operating unit to correct the relative positional relationship between said mask and said substrate.

3. An exposure apparatus according to claim 1, wherein a shape of said light beam is determined depending on that of said first alignment mark.

4. An exposure apparatus according to claim 3, wherein an illuminated size of said light beam is smaller than a size of said first alignment mark.

5. An exposure apparatus according to claim 1, wherein said first alignment mask blocks off said light beam when said light beam is on said first alignment mark and said first detector does not substantially detect said light beam from said second alignment mark.

6. An exposure apparatus according to claim 1, wherein a plurality of said second alignment marks are formed along a direction substantially perpendicular to said predetermined direction.

7. An exposure apparatus according to claim 1, wherein said scanning mechanism has an optical member and said scanning of said beam is performed by movement of said optical member.

8. An exposure apparatus according to claim 7, further comprising: a second detector which detects a position of said optical member.

9. An exposure apparatus according to claim 1, wherein scanning of said scanning mechanism is performed only one time for obtaining said amount of dislocation.

10. An alignment method comprising the steps of:

arranging a mask on which a pattern and a first alignment mark of a light shielding type are formed;

arranging a photosensitive substrate having a second alignment with a length longer in a predetermined direction than that of said first alignment mark so that said second alignment mark is corresponding to said first alignment mark;

scanning light beam along said predetermined direction so as to traverse at least said first alignment mark, said second alignment mark being illuminated with said light beam which passes near said first alignment mark in a scanning of said scanning step;

detecting said light beam reflected on said second alignment mark;

obtaining an amount of dislocation between said mask and said photosensitive substrate on the basis of a detected result obtained in said detecting step; and adjusting the relative position between said mask and said photosensitive substrate on the basis of said amount of dislocation.

11. An alignment method according to claim 10, wherein a shape of said light beam is determined depending on a shape of said first alignment mark.

12. An alignment method according to claim 11, wherein a size of said light beam is smaller than that of said first alignment mark.

13. An alignment method according to claim 10, wherein a plurality of said second alignment marks are formed along a direction substantially perpendicular to said predetermined direction.

14. An alignment method according to claim 10, wherein only one scanning is performed for obtaining the amount of dislocation.

* * * * *